(12) United States Patent
Lin

(10) Patent No.: US 7,558,076 B2
(45) Date of Patent: Jul. 7, 2009

(54) REPLACEABLE BATTERY FIXTURE

(75) Inventor: Linger Lin, Taipei (TW)

(73) Assignee: Inventec Corporation, Taipei (TW)

( * ) Notice: Subject to any disclaimer, the term of this patent is extended or adjusted under 35 U.S.C. 154(b) by 531 days.

(21) Appl. No.: 11/394,398

(22) Filed: Mar. 31, 2006

(65) Prior Publication Data

US 2007/0236904 A1    Oct. 11, 2007

(51) Int. Cl.
H05K 7/02        (2006.01)
H05K 7/04        (2006.01)

(52) U.S. Cl. .................. 361/807; 361/801; 361/802

(58) Field of Classification Search ............. 361/600, 361/679, 683, 684, 756, 715, 801, 802, 752; 361/800, 797, 790, 807; 439/80, 78, 79, 439/55; 180/54.1, 68.5
See application file for complete search history.

(56) References Cited

U.S. PATENT DOCUMENTS 5,678,203 A * 10/1997 Miyazawa ............. 455/90.3
5,890,693 A * 4/1999 Do et al. ............... 248/346.03
5,962,159 A * 10/1999 Satou et al. ................. 429/99
6,563,713 B2 * 5/2003 Yang ......................... 361/752
6,625,041 B1 * 9/2003 Chen ......................... 361/829
2007/0090266 A1 * 4/2007 Hsu ........................... 248/500

* cited by examiner

Primary Examiner—Hung S Bui
(74) Attorney, Agent, or Firm—Peter F. Corless; Steven M. Jensen; Edwards Angell Palmer & Dodge LLP

(57) ABSTRACT

A replaceable battery fixture is disclosed for fixing a replaceable battery device having a first fixing portion and a second fixing portion to a housing of an electronic equipment. The replaceable battery fixture includes a first fixing member for being fixed to the first fixing portion of the replaceable battery device, and a second fixing member for being fixed to the second fixing portion of the battery device. The second fixing member can move bias and elastically in accordance with the housing, so as to bias move the second fixing member by the second fixing portion of the battery device after the first fixing member is fixed to the first fixing portion. A force for bias moving the second fixing member is released when the replaceable battery device reaches to a predetermined position, so that the second fixing member is restored by its elastic force and fixed to the second fixing portion.

5 Claims, 6 Drawing Sheets

REPLACEABLE BATTERY FIXTURE

BACKGROUND OF THE INVENTION

1. Field of the Invention

This invention relates to fixtures, and more particularly, to a replaceable battery fixture for fixing a replaceable battery to an electronic equipment.

2. Description of Related Art

With the development of information technologies, electronic equipments can be embedded with a replaceable battery as an uninterruptible power system, so as to get rid of the restriction of an external power. FIG. 3A is a schematic diagram of a replaceable battery 50 installed in an electronic device according to the prior art. According to the prior art, a plurality of screws 51 are used to fix the replaceable battery 50 to a base housing of the electronic equipment. In details, the replaceable battery 50 is installed on the base housing of the electronic device first. Then correspond the screws 51 to a plurality of tapped holes 54 of the replaceable battery 50, and utilize tools to fix the screws 51 to the replaceable battery 50 and the base housing of the electronic equipment, so as to fix the replaceable battery 50 to the electronic equipment.

FIG. 3B is a schematic diagram of another replaceable battery fixture installed in the electronic device according to the prior art. Firstly, a plurality of fixing racks 53 are added to the base housing of the electronic equipment. Then correspond the fixing racks 53 to the tapped holes 54 of the replaceable battery 50, and utilize a bolt 52 to manually rotate itself into the fixing rack 53, so as to fix the replaceable battery 50 to the electronic equipment. When the replaceable battery 50 is going to be detached from the electronic equipment, rotate the bolt 52 away from the fixing rack 53, and then the replaceable battery 50 is detached from the electronic equipment.

However, in an installing process and a detaching process of a method for fixing the replaceable battery according to the prior art, tools or hands are needed to fix or detach the screws 51 or the bolts 53, this increasing labor and working time. Moreover, having to adding components for combination generates component losing and cost increasing problems.

SUMMARY OF THE INVENTION

In views of the above-mentioned problems of the prior art, it is a primary objective of the present invention to provide an easy-to-manipulate replaceable battery fixture without using any tools.

It is another objective of the present invention to provide a replaceable battery fixture able to save labor and operating time.

To achieve the above-mentioned and other objectives, a replaceable battery fixture is provided according to the present invention. The replaceable battery fixture is used for fixing a replaceable battery device having a first fixing portion and a second fixing portion to a housing of an electronic equipment. The replaceable battery fixture includes a first fixing member for being fixed to the first fixing portion of the replaceable battery device so as to fix the battery device to the housing, the first fixing member having a plurality of first hooking portions; and a second fixing member for being fixed to the second fixing portion of the battery device so as to fix the battery device to the housing, the second fixing member being capable of moving bias and elastically in relation to the housing, so as to bias move the second fixing member by the second fixing portion of the battery device after the first fixing member is fixed to the first fixing portion, wherein a force for bias moving the second fixing member is released when the replaceable battery device reaches to a predetermined position, so that the second fixing member is restored by its elastic force and fixed to the second fixing portion.

The second fixing member is made of an elastic material. The elastic material is stainless steel. The first fixing member is integrated with the housing. The second fixing member includes a second hooking portion, a plurality of locking portions and a sliding surface portion. The second fixing member is integrated with the second hooking portion.

If the battery device is going to be installed on the electronic equipment, the first fixing portion is fixed to the first hooking portion of the first fixing member, so as to fix the battery device to the housing. Since the second fixing member can bias and elastically move in accordance with the housing, when first fixing member is fixed to the first fixing portion of the battery device, the battery device is pressed downward to slide downward along the sliding surface portion of the second fixing member. A second end of the battery device thus biases the second fixing member. Therefore, after the battery device reaches to a predetermined position, a force biasing the second fixing member is released, enabling the second fixing member to restore by its elastic force and fix to the second fixing portion of the battery device.

If the battery device is going to be detached from the electronic equipment, the sliding surface portion of the second fixing member is pushed by a force toward a direction indicated by arrow A. Because the second fixing member is made of elastic materials, when the second fixing member is pushed, the second hooking portion will be detached from the second fixing portion of the battery device. Then remove the first hooking portion of the first fixing member from the first fixing portion of the battery device, and the battery device can be detached from the electronic equipment.

The replaceable battery fixture of the present invention makes the use of the first fixing member and the second fixing member to fix the battery device to the electronic equipment. The replacement battery fixture has a simple structure, does not need any additional components, and has a low manufacturing cost.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENTS

The following illustrative embodiments are provided to illustrate the disclosure of the present invention, these and other advantages and effects can be apparently understood by those in the art after reading the disclosure of this specification. The present invention can also be performed or applied by other different embodiments. The details of the specification may be on the basis of different points and applications, and numerous modifications and variations can be devised without departing from the spirit of the present invention.

Figure 1A:
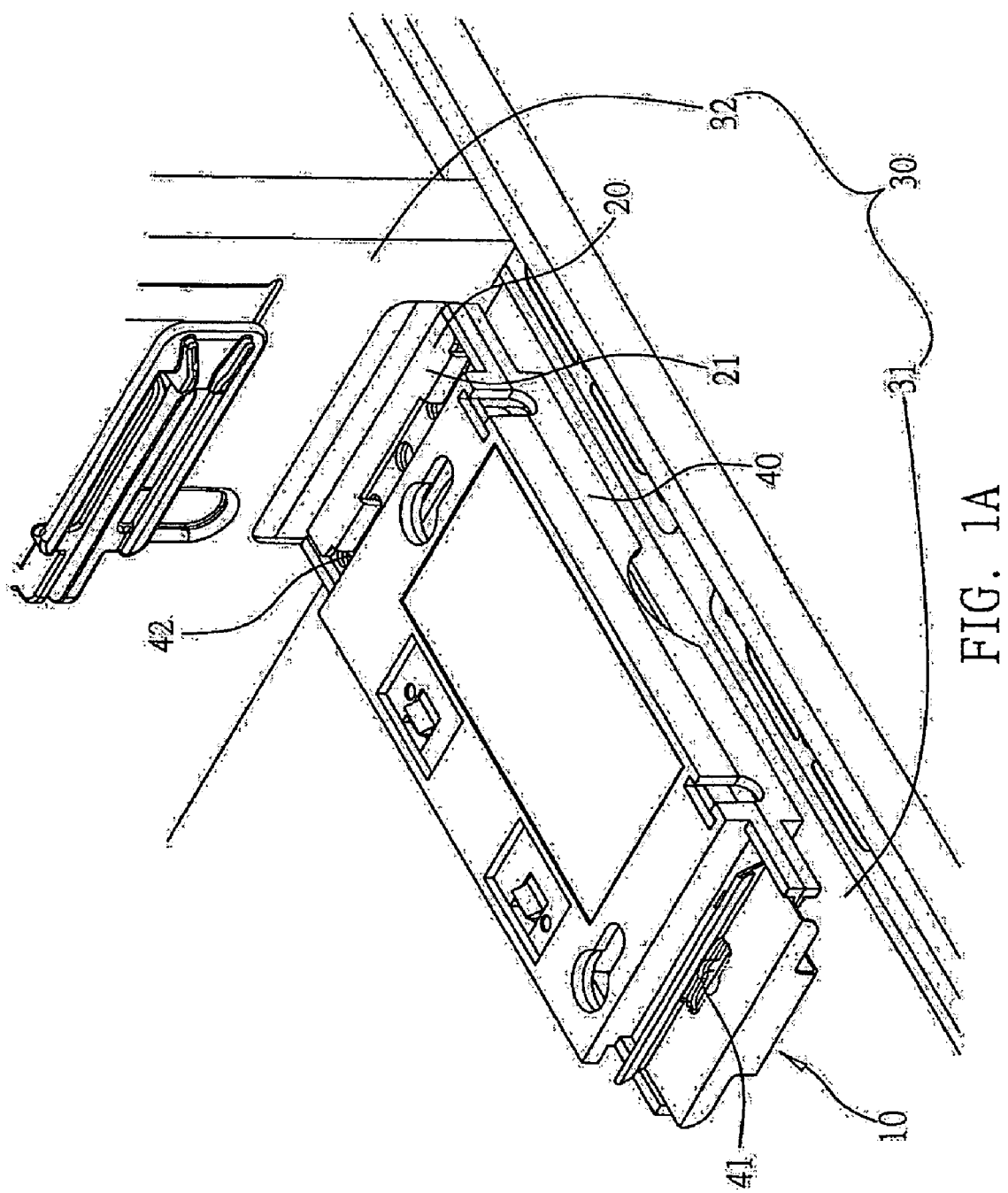
FIGS. 1A and 1B are two schematic diagrams of a replaceable battery fixture of the preferred embodiment according to the present invention.
Figure 1B:
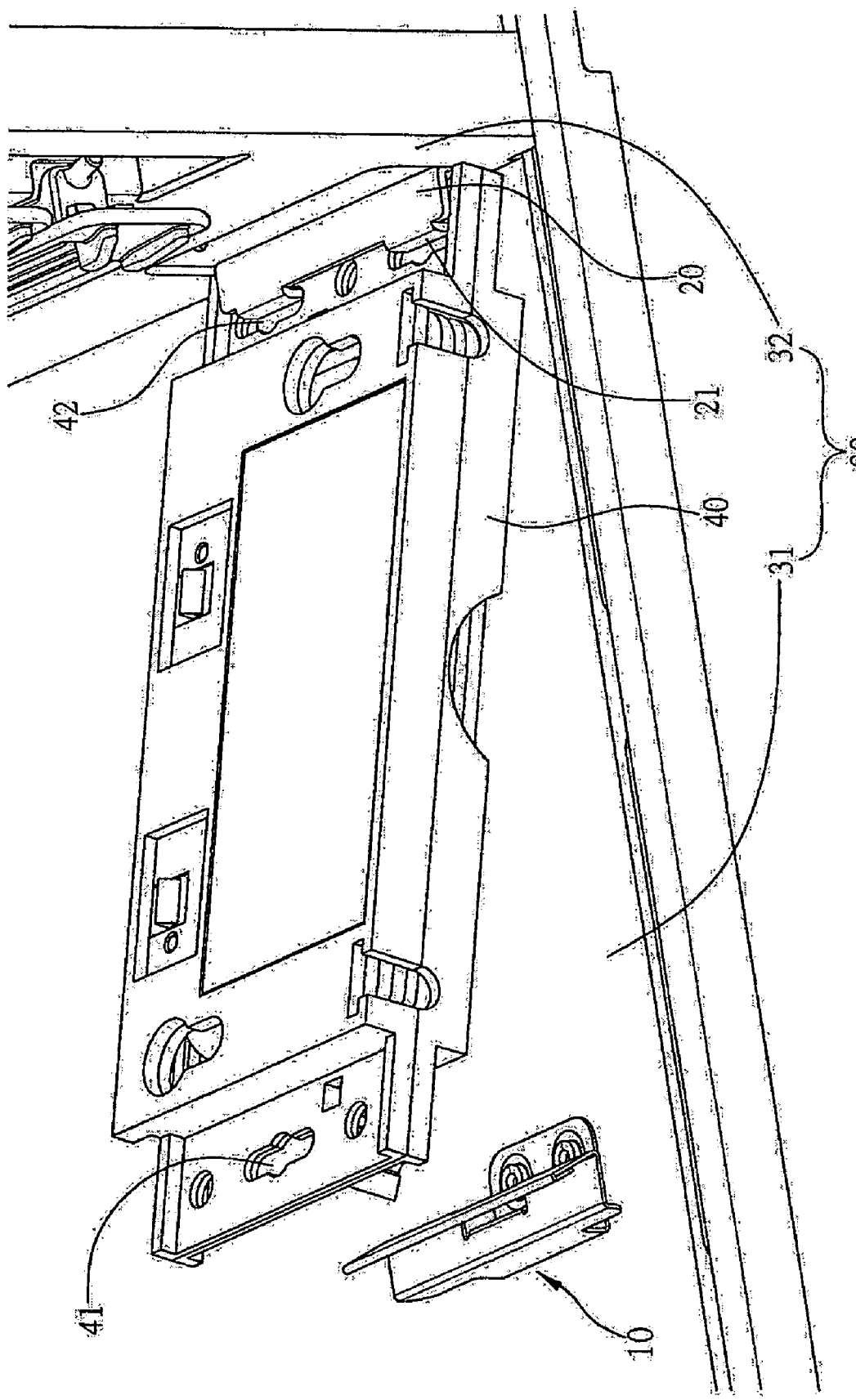

FIGS. 1A and 1B are two schematic diagrams of a replaceable battery fixture of the preferred embodiment according to the present invention. The replaceable battery fixture comprises a second fixing member 10 and a first fixing member 20, both of which are used for installing a battery device 40 having a first fixing portion 42 and a second fixing portion 41 onto an electronic device 30 having two housings 31 and 32. The first fixing portion 42 and the second fixing portion 41 are installed on two ends of the battery device 40 and corresponding to the first fixing member 20 and the second fixing member 10 respectively.

Figure 2A:
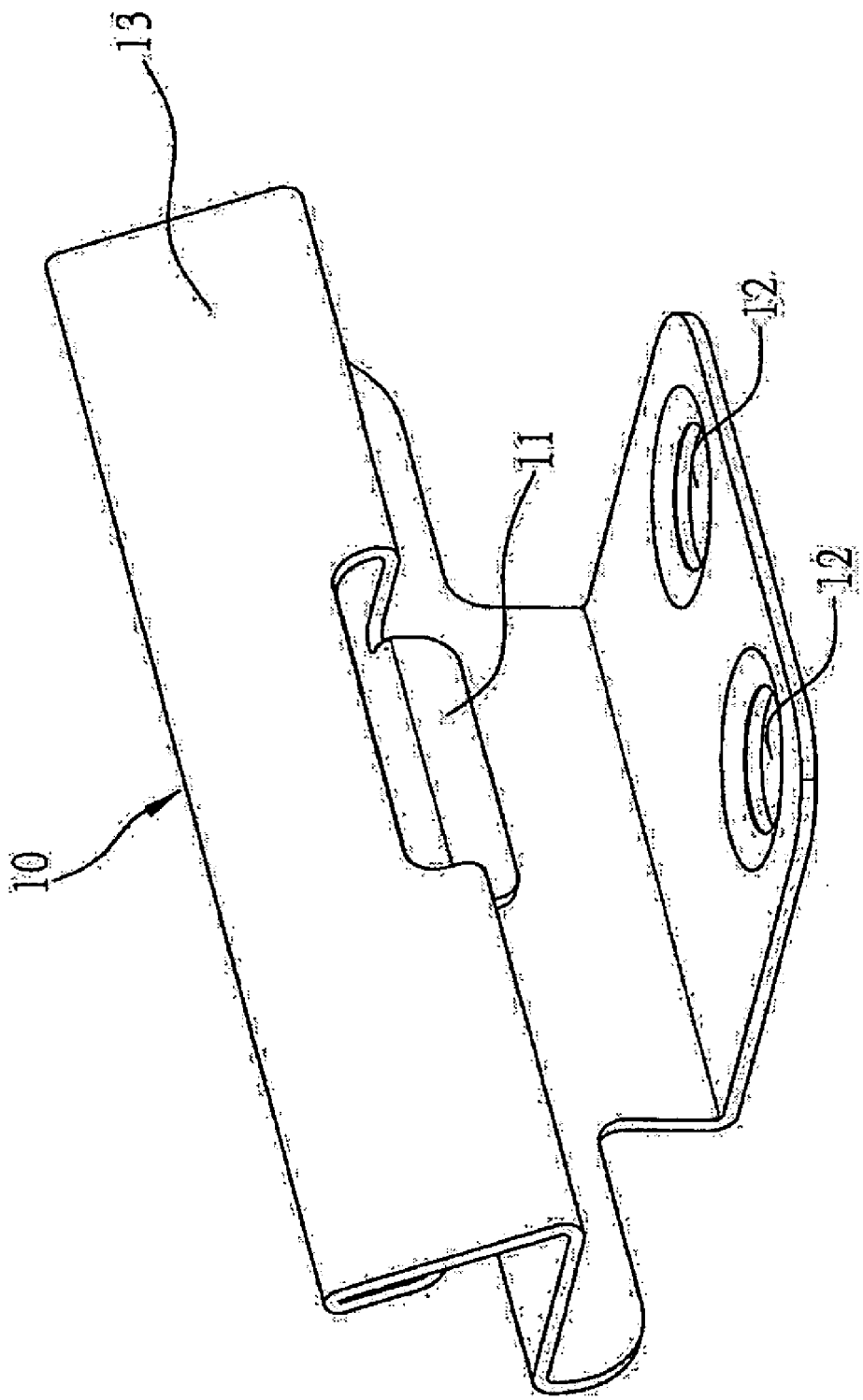
FIGS. 2A is a schematic diagram of a first fixing member of the present invention.
Figure 2B:
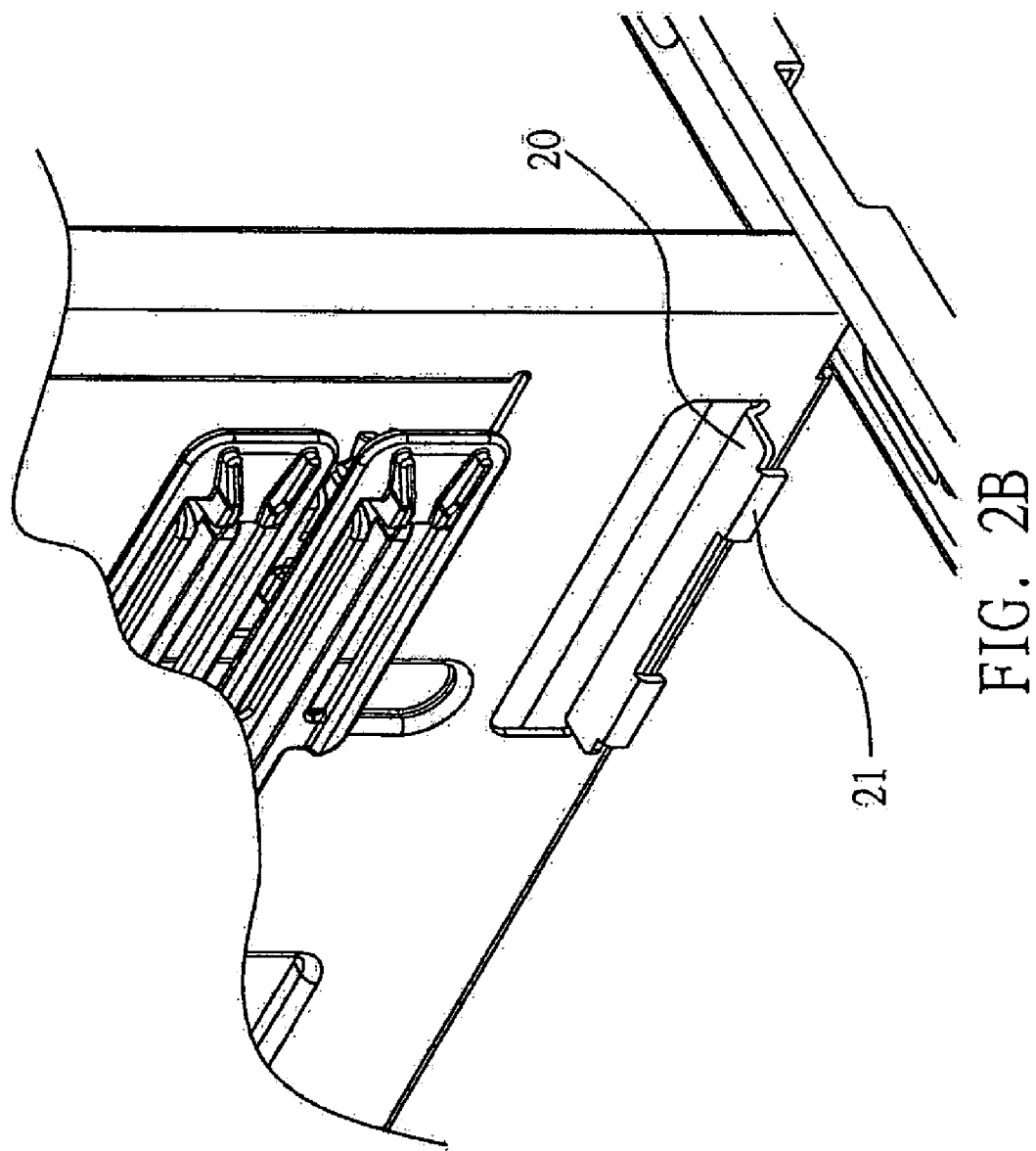
FIGS. 2B is a schematic diagram of a second fixing member of the present invention.
Figure 3A:
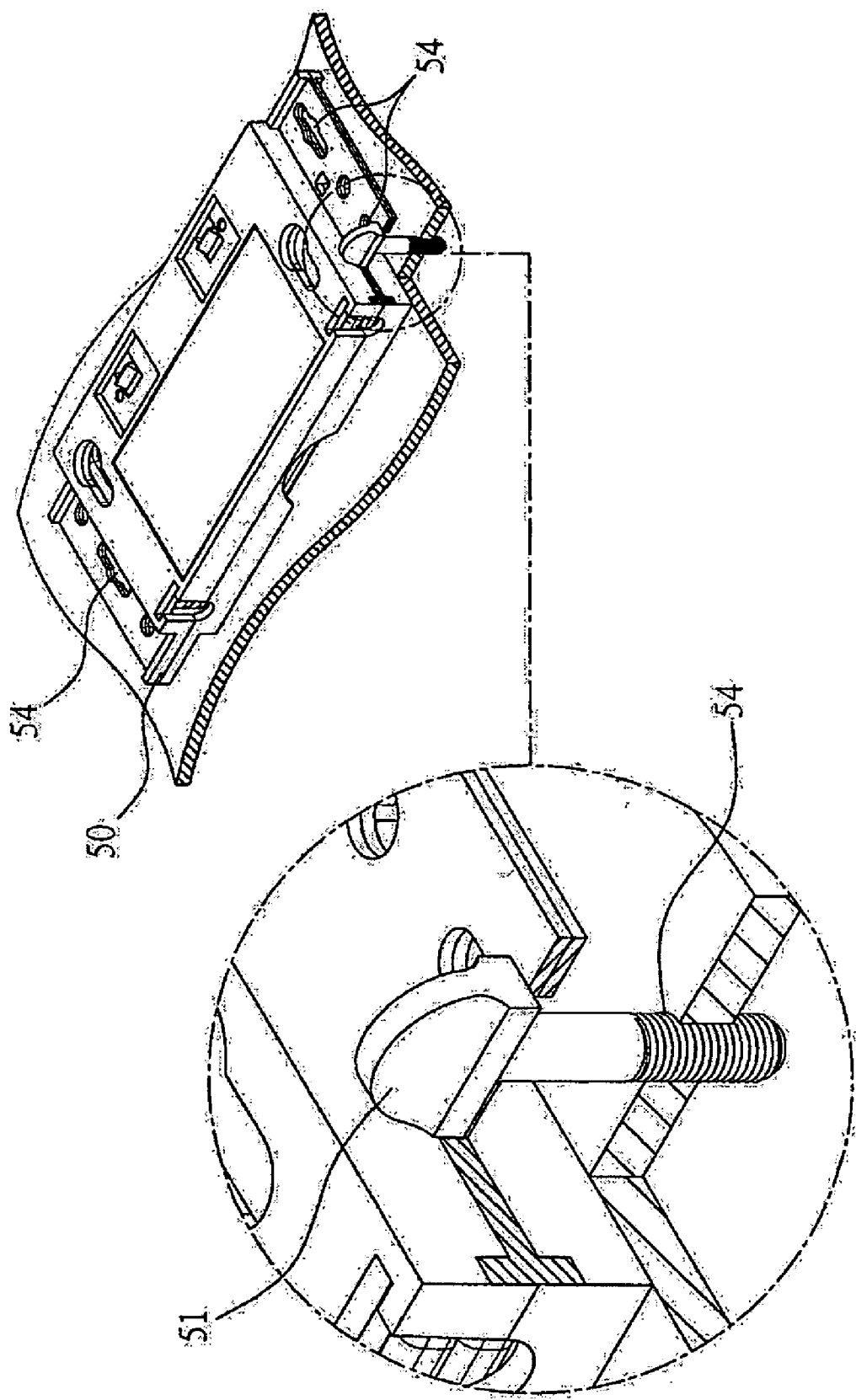
FIG. 3A is a schematic diagram of a replaceable battery fixture installed in an electronic device according to the prior art.
Figure 3B:
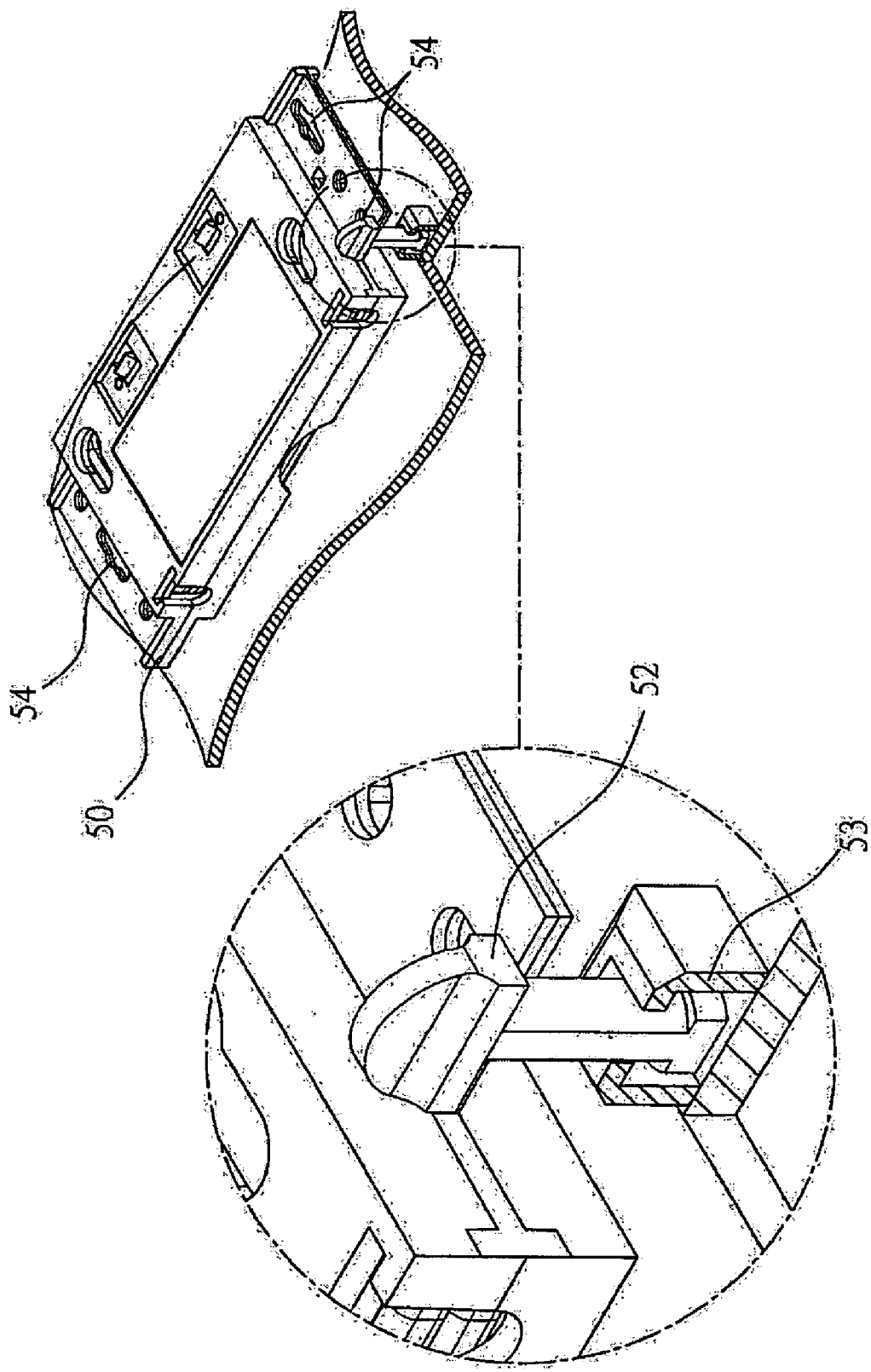
FIG. 3B is a schematic diagram of another replaceable battery fixture installed in an electronic device according to the prior art.

FIGS. 2A and 2B are two schematic diagrams of the first fixing member 20 and the second fixing member 10 of the present invention. As shown in these figures, the second fixing member 10 is used to fix the battery device 30 to the housing 31, and the second fixing member 10 comprises a second hooking portion 11, a plurality of locking portions 12 and a sliding surface portion 13. The second fixing member 10 is integrated with the second hooking portion 11. The first fixing member 20 is made of elastic materials such as stainless steel. The locking portion 12, along with electronic components such as screws or bolts, locks the second fixing member 10 to the housing 31.

The first fixing member 20 is used for fixing the battery device 40 to the housing 32 of the electronic device 30. The first fixing member 20 comprises a plurality of first hooking portions 21. The first fixing member 20 is integrated with the housing 31.

If the battery device 40 is going to be installed on the electronic device 30, the first fixing portion 42, which is installed on a first end of the battery device 40, is fixed to the first hooking portion 21 of the first fixing member 20 first, so as to fix the battery device 40 to the housing 32. Since the second fixing member 10 can bias and elastically move in accordance with the housing 31, when the first fixing member 20 is fixed to the first fixing portion 42 of the battery device 40, the battery device 40 is pressed downward to slide downward along the sliding surface portion 12 of the second fixing member 10. A second end of the battery device 40 thus biases the second fixing member 10. Therefore, after the battery device 40 reaches to a predetermined position, a force biasing the second fixing member 10 is released, enabling the second fixing member 10 to restore by its elastic force and fix to the second fixing portion 41 of the battery device 40.

If the battery device 40 is going to be detached from the electronic device 30, the sliding surface portion 13 of the second fixing member 10 is pushed by a force toward a direction indicated by arrow A. Because the second fixing member 10 is made of elastic materials, when the second fixing member 10 is pushed, the second hooking portion 11 will be detached from the second fixing portion 41 of the battery device 40. Then remove the first hooking portion 21 of the first fixing member 20 from the first fixing portion 42 of the battery device 40, and the battery device 40 can be detached from the electronic device 30.

The replaceable battery fixture of the present invention makes the use of the first fixing member and the second fixing member to fix the battery device to the electronic equipment. The replacement battery fixture has a simple structure, does not need any additional components, and has a low manufacturing cost.

Moreover, the replaceable battery fixture is easily manipulated. Without any tools, a user can still fix the battery device to the electronic device with the replaceable battery fixture, so as to save labor and operation time.

The foregoing descriptions of the detailed embodiments are only illustrated to disclose the features and functions of the present invention and not restrictive of the scope of the present invention. It should be understood to those in the art that all modifications and variations according to the spirit and principle in the disclosure of the present invention should fall within the scope of the appended claims.

What is claimed is:

1. A replaceable battery fixture for fixing a replaceable battery device having a first fixing portion and a second fixing portion to a housing of an electronic device, the replaceable battery fixture comprising:

a first fixing member for being fixed to the first fixing portion of the replaceable battery device so as to fix the battery device to the housing, the first fixing member comprising a plurality of first hooking portions; and a second fixing member for being fixed to the second fixing portion of the battery device so as to fix the battery device to the housing, the second fixing member being capable of moving bias and elastically in relation to the housing, so as to bias move the second fixing member by the second fixing portion of the battery device after the first fixing member is fixed to the first fixing portion, wherein a force for bias moving the second fixing member is released when the replaceable battery device reaches to a predetermined position, so that the second fixing member is restored by its elastic force and fixed to the second fixing portion, and wherein the second fixing member comprises a second hooking portion, a plurality of locking portions and a sliding surface portion.

2. The replaceable battery fixture of claim 1, wherein the second fixing member is made of an elastic material.

3. The replaceable battery fixture of claim 2, wherein the elastic material is stainless steel.

4. The replaceable battery fixture of claim 1, wherein the first fixing member is integrated with the housing.

5. The replaceable battery fixture of claim 1, wherein the second fixing member is integrated with the second hooking portion.

* * * * *